United States Patent [19]
Itoh

[11] Patent Number: 5,994,036
[45] Date of Patent: Nov. 30, 1999

[54] METHOD OF FORMING A RESIST PATTERN

[75] Inventor: Katsuyuki Itoh, Tokyo, Japan

[73] Assignee: NEC Corporation, Tokyo, Japan

[21] Appl. No.: 08/805,153

[22] Filed: Feb. 24, 1997

[30] Foreign Application Priority Data

Feb. 23, 1996 [JP] Japan ................................. 8-036037

[51] Int. Cl.$^6$ ................................................. H01L 21/027
[52] U.S. Cl. ......................... 430/327; 430/322; 430/330
[58] Field of Search ................................. 430/322, 327, 430/330

[56] References Cited

U.S. PATENT DOCUMENTS

| | | | |
|---|---|---|---|
| 5,127,362 | 7/1992 | Iwatsu | 118/667 |
| 5,300,400 | 4/1994 | Schwain | 430/306 |

FOREIGN PATENT DOCUMENTS

| | | |
|---|---|---|
| 4-221814 | 8/1992 | Japan . |
| 7-50241 | 2/1995 | Japan . |
| 7-146547 | 6/1995 | Japan . |

*Primary Examiner*—John A. McPherson
*Attorney, Agent, or Firm*—Young & Thompson

[57] ABSTRACT

A method of forming a resist pattern comprises the following steps. A resist is applied on a wafer for subsequent baking the same. Subsequently, the resist-applied wafer is then stored in an atmosphere maintained at a humidity of not less than 80% until the resist-applied wafer is placed in an exposure system for exposure thereof by use of a photomask. A development of the exposed resist on the wafer is carried out to form a resist pattern. It is possible to further store the wafer in a clean room before the exposure. The above resist is preferably a chemical sensitizing resist.

7 Claims, 3 Drawing Sheets temperature: 23°C
humidity: 80%

METHOD OF FORMING A RESIST PATTERN

BACKGROUND OF THE INVENTION

The present invention relates to a method of forming a resist pattern in a micro-lithography technique.

In recent years, as the semiconductor devices have been scaled down increasingly, the stability of micro-lithography technique and uniformity of the resist pattern have been required. In the micro-lithography processes, a resist is first applied on a semiconductor wafer for subsequent baking thereof before an exposure of the baked resist is carried out by use of a described photo-mask pattern such as reticle. Subsequently, the exposed resist is baked and the development thereof is then carried out to thereby form a photo-resist pattern. The photo-resist pattern is then used as a mask for etching the wafer before the used photo-resist pattern is removed. In such photo-lithography processes, the exposure system is most expensive, for which reason it is required to increase the rate of operation of the exposure system. In order to satisfy this requirement, the number of resist application systems is increased so that resist can be applied fast for subsequent exposure treatment by the exposure system without any rest. Such production management has the following difficulty. The number of wafers to be processed in one time is likely to be different for every system. In this case, it is conventional to temporarily store the wafers applied with resist in a wafer storage buffer provided between the resist-application system and the exposure system for subsequent supply thereof into the exposure system. It was found that the storage of the resist-applied wafer in the wafer storage buffer after the resist was applied to the wafer and before the resist-applied wafer will be exposed may cause a variation in scale of the resist pattern. The variation in scale of the resist pattern might depend upon the time of storage of the resist-applied wafer in the wafer storage buffer.

At present, a chemical sensitizing negative resist is generally used. The size of the chemical sensitizing negative resist was measured with reference to variation in storage time "Th" during which the resist-applied wafer is stored in the wafer storage buffer after the resist-applied wafer was baked until the stored resist is then placed into the exposure system, provided that a time from the resist exposure until the development is fixed. The wafer is stored in a standard atmosphere in the clean room. The exposure conditions are selected under which if the storage time is zero, the size of the resist pattern corresponds to the designed size. The result of measurement is shown in FIG. 1, from which it can be understood that as the storage time Th becomes long, then the resist pattern size becomes reduced until the storage time Th becomes 40 minutes.

The storage time from baking the exposed wafer until the development thereof relates to the degree of influence to the variation in size of the resist pattern. The resist is made of an organic material, for which reason an atmosphere in the resist-application system chamber is almost 100%-organic atmosphere but no moisture is present. The resist-applied wafer will have received a certain influence by humidity when the resist-applied wafer is pull out of the resist-application system. The moisture is taken into the resist in the moisture rich atmosphere. Particularly, the moisture content in the resist is certainly increased when the resist will have been stored in the wafer storage buffer.

If the size of the resist is once varied by absorbing the moisture in the storage time duration between baking the resist-applied wafer and the exposure thereof, then the size of the resist pattern is then also varied from the designed value. Particularly if the line width of the resist pattern is in the sub-half micron order or not more than 0.25 micrometers, then the chemical sensitizing resist is preferably used in the light of sensitivity and resolution. Notwithstanding, the chemical sensitizing resist is likely to vary in size largely by absorbing the moisture, for which reason the line width of the resist pattern is varied by only 0.05 micrometers. This however means that 20% variation in size thereof appears if the line width of the resist pattern is in the sub-half micron order or 0.25 micrometers.

Against the above problems, it is required to do a strict management of the temperature and humidity around the resist. A method of maintaining the resist-applied wafer at predetermined temperature and humidity is disclosed in the Japanese laid-open patent publication No. 4-326509. A central control system or a process control box is provided on the resist process line for controlling the temperature and humidity around the resist-applied wafer in the stand-by state in the wafer storage buffer. The Japanese laid-open patent publication No. 4-326509 does not mention how to control the temperature and humidity around the resist-applied wafer stored in the wafer storage buffer, for which reason it is difficult to apply the above prior art practically. Normally, the clean room is maintained at a temperature in the range of 23–25° C. and at a humidity of about 45%. If the resist-applied wafer is placed in the clean room for the purpose of storage thereof, then the temperature and humidity are well controlled and maintained stable. Accordingly, it is considered that variations in temperature and humidity of the atmosphere is well suppressed in the clean room so that the variation in size of the resist pattern caused by variation in the content of the moisture in the resist is well suppressed even if the resist-applied is stored in the clean room. The above prior art needs to use large scale equipment such as the central control system and the process control box for controlling the temperature and humidity of the atmosphere around the resist-applied wafer stored in the wafer storage buffer, for which reason the above prior art is costly.

In the above circumstances, it had been required to develop a novel method of forming a resist pattern free from any variation in size thereof and applicable to a sub-half micron photolithography process without any increase in the equipment cost.

The present invention provides a method of storing a resist-applied wafer having been baked until an exposure thereof by use of a photo-mask, wherein the resist-applied wafer is placed in an atmosphere maintained at a humidity of not less than 80%. It is preferable that the resist-applied wafer is placed in an atmosphere maintained at a temperature not lower than the room temperature for at least about 10 minutes. It is also preferable that the resist-applied wafer is placed in an atmosphere maintained at a humidity of not less than 90% for at least about 5 minutes. It is possible to further store the wafer in a clean room before the exposure.

The present invention also provides a method of forming a resist pattern which comprises the following steps. A resist is applied on a wafer for subsequent baking the same. Subsequently, the resist-applied wafer is then stored in an atmosphere maintained at a humidity of not less than 80% until the resist-applied wafer is placed in an exposure system for exposure thereof by use of a photo-mask. A development of the exposed resist on the wafer is carried out to form a resist pattern. It is possible to further store the wafer in a clean room before the exposure. The above resist is preferably a chemical sensitizing resist.

BRIEF DESCRIPTIONS OF THE DRAWINGS

Preferred embodiments of the present invention will be described in detail with reference to the accompanying drawings.

PREFERRED EMBODIMENTS

A first embodiment according to the present invention will be described in detail with reference to FIGS. 2 and 3, wherein a novel method of forming a resist pattern is provided.

Figure 2:
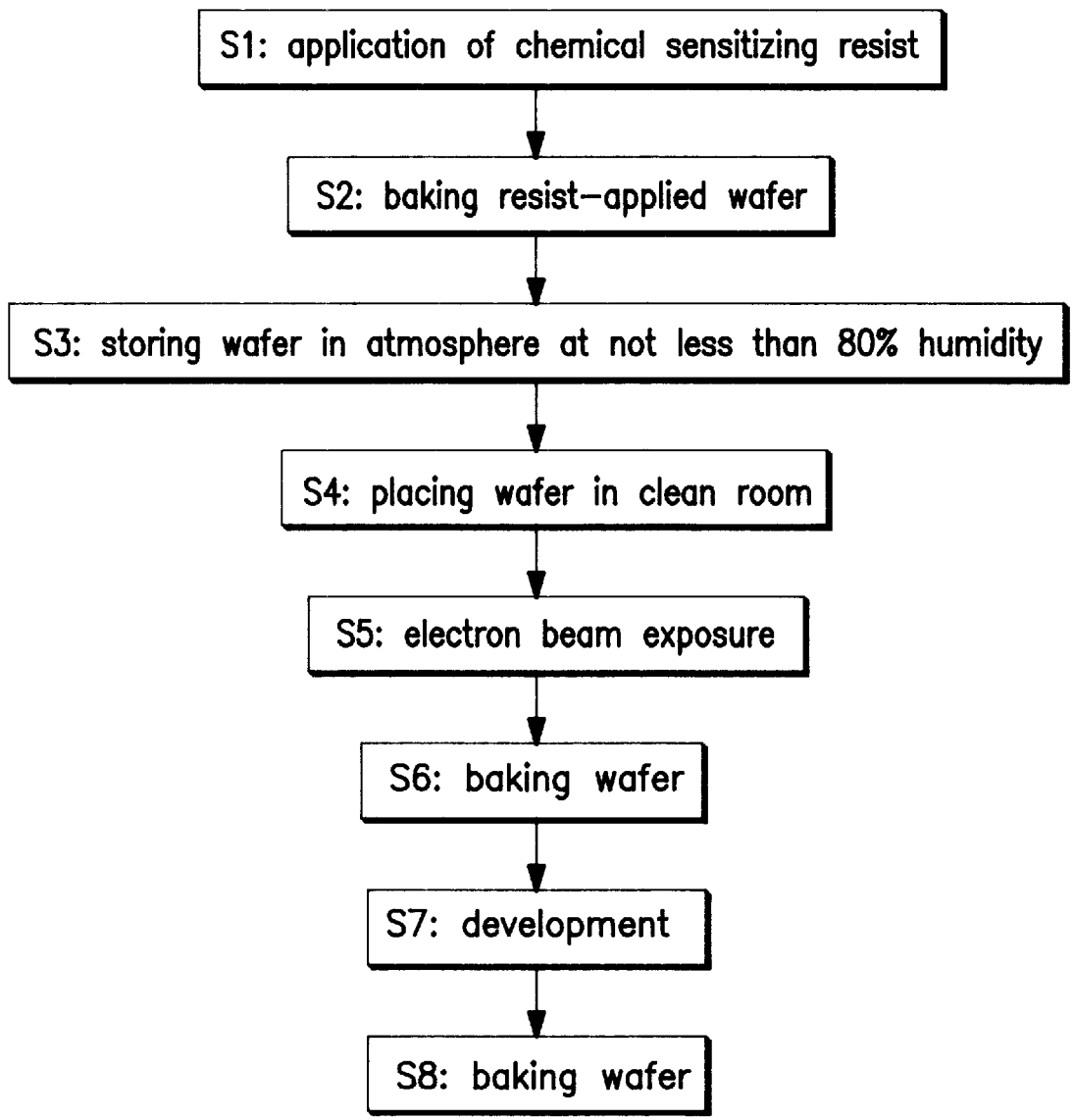
FIG. 2 is a flow chart illustrative of a novel method of forming a resist pattern in accordance with the present invention.

With reference to FIG. 2, a chemical sensitizing resist is applied on a surface of a wafer so that the chemical sensitizing resist has a thickness of 0.7 micrometers in the first step S1. The chemical sensitizing resist-applied wafer is baked for about 60 seconds in the second step S2. Subsequently, the resist-applied wafer is then placed in a desiccator for various times, wherein an atmosphere is maintained at a humidity of 80% and at a temperature of 23° C. for 10 minutes in the third step S3. The resist-applied wafer is then pull out of the desiccator and left in a clean room maintained at a temperature in the range of 23–25° C. and at a humidity of about 45% for various times in the fourth step S4. The resist-applied wafer is then exposed to an electron beam in the fifth step S5. The wafer is then baked in the sixth step S6. A development of the resist on the wafer is carried out by TMAH in the seventh step S7. The wafer is further baked in the eighth step S8 to thereby form a resist pattern.

The above eight processes are made for both wafers having 0.20 micrometers and 0.25 micrometers in diameter under various conditions of various storage times, 0 minute, 10 minutes, 30 minutes, 60 minutes, 90 minutes and 120 minutes during which the resist-applied wafer is stored in the clean room.

Figure 1:
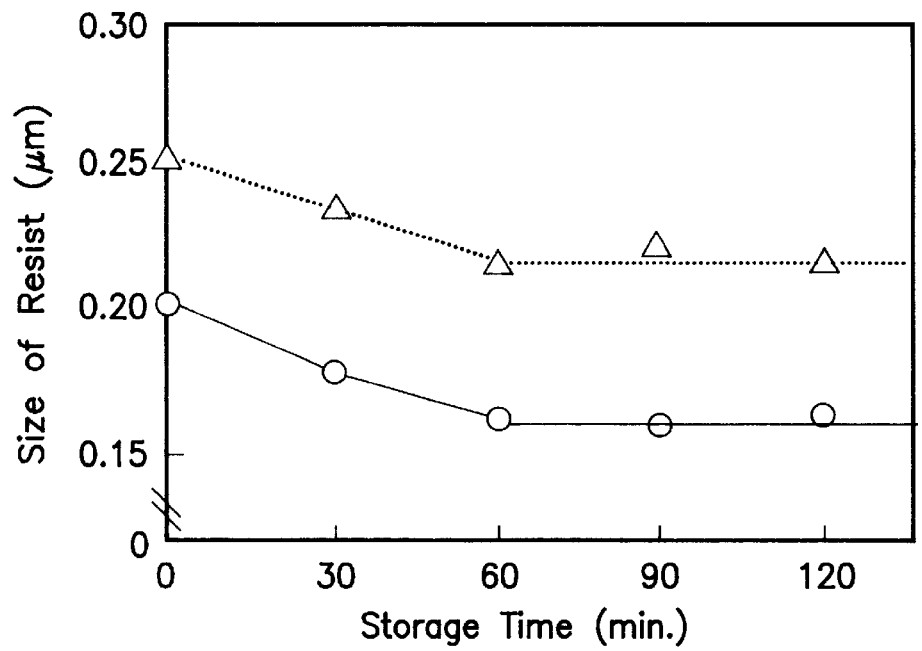
FIG. 1 is a diagram illustrative of variations in size of a chemical sensitizing negative resist versus storage time "Th" during which the resist-applied wafer having already been baked is stored in the until the stored resist will then enter into the exposure system in the conventional storage method.
Figure 3:
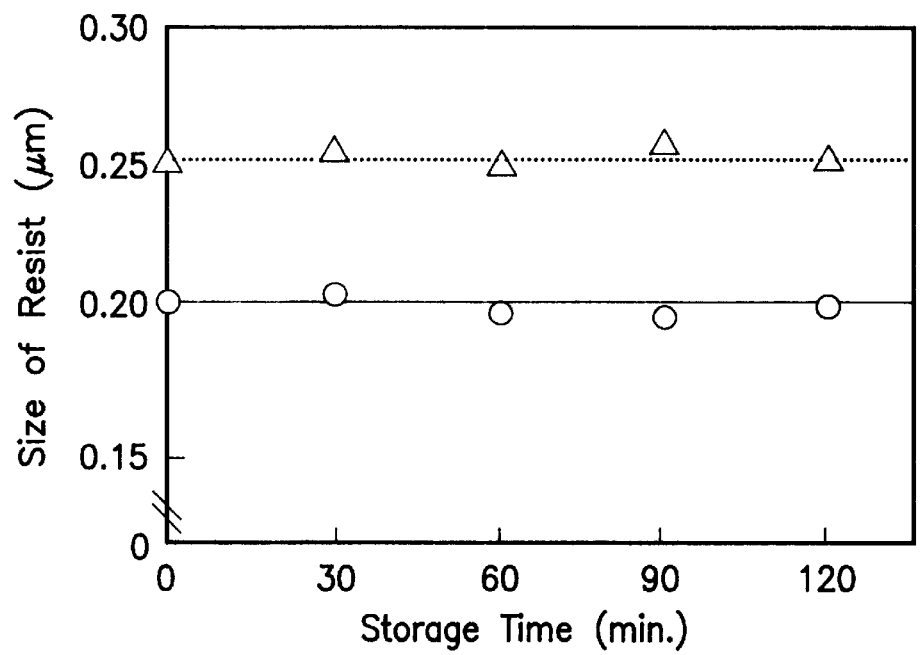
FIG. 3 is a diagram illustrative of variations in size of a chemical sensitizing resist versus storage time "Th" during which the resist-applied wafer having already been baked is stored in an atmosphere maintained at a humidity of 80% and at a temperature of 23° C. until the stored resist will then enter into the exposure system in a first embodiment according to the present invention.

FIG. 3 illustrates the result of the measurement of size of the chemical sensitizing resist pattern on the wafer versus various storage time "Th" during which the resist-applied wafer having already been baked is stored in the clean room. The size of the resist pattern on the wafer measured when the storage time is zero is considered to be a reference size for comparison of each size of the resist pattern when the storage time is varied from zero up to 120 minutes. FIG. 3 demonstrates that if the storage time is within 120 minutes, variations in size of the resist pattern on the wafer does never depend upon the storage time and be within ±10%.

The reason why the variation in size of the resist pattern is suppressed is as follows. The chemical sensitizing resist generates acid by exposure to the beam such as electron beam. This generated acid is likely to be diffused depending upon the temperature and humidity of the resist. The variation in size over time is largely dependent upon the humidity. Until the humidity becomes a critical point over which no variation in size of the resist is caused, suppression force to the diffusion of acid through the resist increases with an increase in the humidity of the resist, for which reason if the atmospheric condition is varied to vary the humidity, then the size of the resist pattern is varied depending upon the humidity condition. If, however, the humidity of the resist is maintained over the critical humidity point, then the acid is unlikely to move or be diffused through the resist, for which reason any variation in size of the resist is unlikely to be caused. In accordance with the present invention, the humidity of the resist is maintained above the critical point so that no movement or diffusion of the generated acid through the resist is caused whereby no variation in size of the resist pattern is caused. The resist on the wafer is maintained at a humidity which is excessively higher than that of the normal clean room. If the humidity of the resist is increased up to the above critical point over which no movement nor diffusion of the generated acid is caused in the resist, then it is required to leave the resist applied on the wafer in the clean room but for about 60 minutes. By contrast, if the resist applied on the wafer is left in the moisture-rich atmosphere having a humidity over 80% for only 10 minutes, then the humidity of the resist is increased up to over the critical point above which no movement nor diffusion of the generated acid through the resist is caused.

As described above, in accordance with he present invention, the resist applied on the wafer is stored in an excessively moisture-rich atmosphere maintained at a humidity of not less than 80% so that no movement nor diffusion of the generated acid through the chemical sensitizing resist is caused whereby it is possible to form the resist pattern in sub-half micron order without, however, any substantive variation in size of the resist pattern.

A second embodiment according to the present invention will be described in detail with reference to FIGS. 2 and 4, wherein a further novel method of forming a resist pattern is provided.

With reference to FIG. 2, a chemical sensitizing resist is applied on a surface of a wafer so that the chemical sensitizing resist has a thickness of 0.7 micrometers in the first step S1. The chemical sensitizing resist-applied wafer is baked for about 60 seconds in the second step S2. Subsequently, the resist-applied wafer is then placed in a desiccator for various times, wherein an atmosphere is maintained at a humidity of 90% and at a temperature of 45° C. for 5 minutes in the third step S3. The resist-applied wafer is then pull out of the desiccator and left in a clean room maintained at a temperature in the range of 23–25° C. and at a humidity of about 45% for various times in the fourth step S4. The resist-applied wafer is then exposed to an electron beam in the fifth step S5. The wafer is then baked in the sixth step S6. A development of the resist on the wafer is carried out by TMAH in the seventh step S7. The wafer is further baked in the eighth step S8 to thereby form a resist pattern.

The above eight processes are made for both wafers having 0.20 micrometers and 0.25 micrometers in diameter under various conditions of various storage times, 0 minute, 10 minutes, 30 minutes, 60 minutes, 90 minutes and 120 minutes during which the resist-applied wafer is stored in the clean room.

Figure 4:
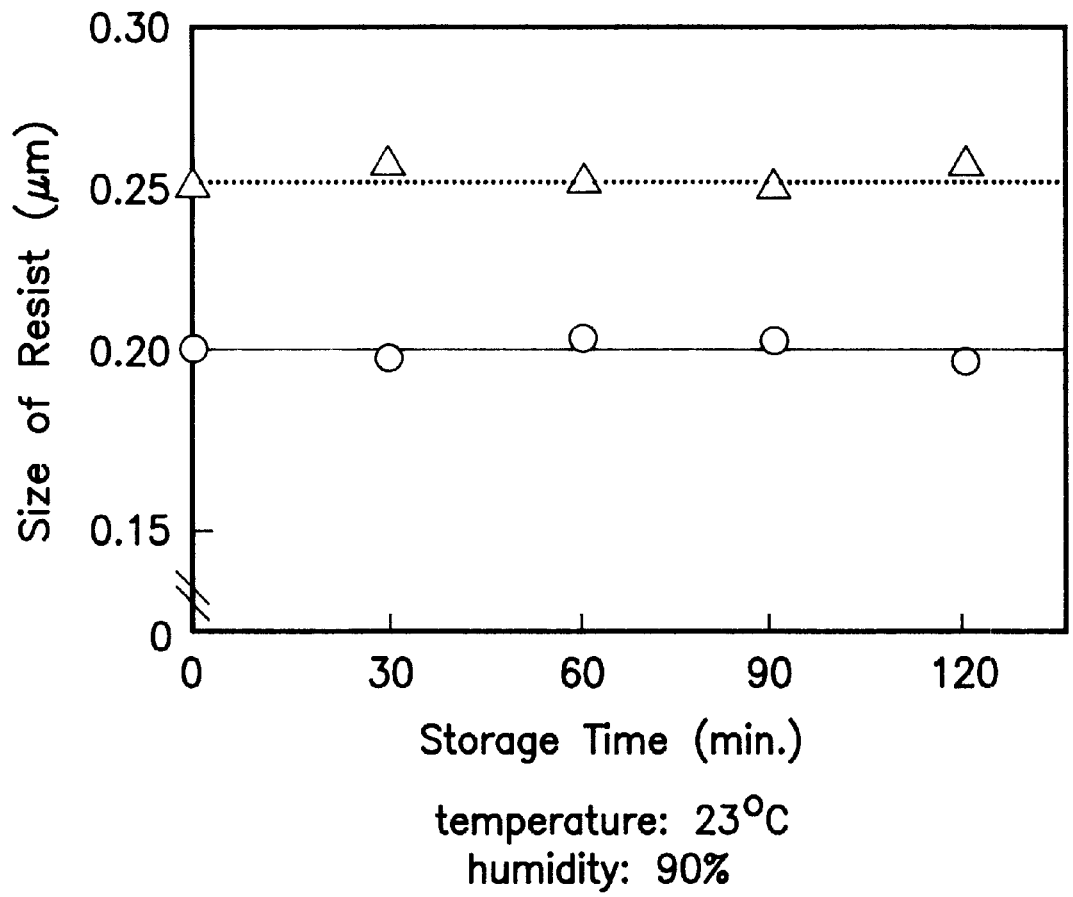
FIG. 4 is a diagram illustrative of variations in size of a chemical sensitizing resist versus storage time "Th" during which the resist-applied wafer having already been baked is stored in an atmosphere maintained at a humidity of 90% and at a temperature of 45° C. until the stored resist will then enter into the exposure system in a second embodiment according to the present invention.

FIG. 4 illustrates the result of the measurement of size of the chemical sensitizing resist pattern on the wafer versus various storage times "Th" during which the resist-applied wafer having already been baked is stored in the clean room. The size of the resist pattern on the wafer measured when the storage time is zero is considered to be a reference size for comparison of each size of the resist pattern when the storage time is varied from zero up to 120 minutes. FIG. 3 demonstrates that if the storage time is within 120 minutes, variations in size of the resist pattern on the wafer does never depend upon the storage time and be within ±10%.

The reason why the variation in size of the resist pattern is suppressed is as follows. The chemical sensitizing resist generates acid by exposure to the beam such as electron beam. This generated acid is likely to be diffused depending upon the temperature and humidity of the resist. The variation in size over time is largely dependent upon the humidity. Until the humidity becomes a critical point over which no variation in size of the resist is caused, suppression of the diffusion of acid through the resist increases with an increase in the humidity of the resist, for which reason if the atmospheric condition is varied to vary the humidity, then the size of the resist pattern is varied depending upon the humidity condition. If, however, the humidity of the resist is maintained over the critical humidity point, then the acid is unlikely to move or be diffused through the resist, for which reason any variation in size of the resist is unlikely to be caused. In accordance with the present invention, the humidity of the resist is maintained above the critical point so that no movement or diffusion of the generated acid through the resist is caused whereby no variation in size of the resist pattern is caused. The resist on the wafer is maintained at a humidity which is excessively higher than that of the normal cream room. If the humidity of the resist is increased up to the above critical point over which no movement nor diffusion of the generated acid is caused in the resist, then it is required to leave the resist applied on the wafer in the clean room but for about 60 minutes. By contrast, if the resist applied on the wafer is left in the moisture-rich atmosphere having a humidity over 90% for only 5 minutes, then the humidity of the resist is increased up to over the critical point above which no movement nor diffusion of the generated acid through the resist is caused.

As described above, in accordance with he present invention, the resist applied on the wafer is stored in an excessively moisture-rich atmosphere maintained at a humidity of not less than 90% so that no movement or diffusion of the generated acid through the chemical sensitizing resist is caused whereby it is possible to form the resist pattern in sub-half micron order without, however, any substantive variation in size of the resist pattern.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of storing a semiconductor wafer between application of a resist to a surface thereof and exposure of the resist, the method being carried out in a clean room having a constant room temperature and a constant relative humidity, the method comprising the steps of:

immediately after application of the resist to the wafer and before exposure of the resist, placing the wafer in an environment having a relative humidity of at least 90% and a temperature of about 45° C. for about 5 minutes; and removing the wafer from the environment and storing the wafer in the clean room at the clean room temperature and humidity.

2. The method of claim 1, wherein the humidity of the environment is at least 95%.

3. The method of claim 2, wherein the clean room temperature is 23–25° C.

4. The method of claim 3, wherein the clean room humidity is about 45%.

5. The method of claim 1, wherein the clean room temperature is 23–25° C.

6. The method of claim 5, wherein the clean room humidity is about 45%.

7. The method of claim 1, wherein the clean room humidity is about 45%.

* * * * *